(12) United States Patent
Walker et al.

(10) Patent No.: US 7,953,921 B2
(45) Date of Patent: May 31, 2011

(54) DIRECTED AUTO-REFRESH SYNCHRONIZATION

(75) Inventors: Robert Michael Walker, Raleigh, NC (US); Perry Willmann Remaklus, Jr., Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 308 days.

(21) Appl. No.: 11/115,915

(22) Filed: Apr. 27, 2005

(65) Prior Publication Data

US 2006/0143372 A1    Jun. 29, 2006

Related U.S. Application Data

(60) Provisional application No. 60/640,100, filed on Dec. 28, 2004.

(51) Int. Cl.
*G06F 13/00* (2006.01)
(52) U.S. Cl. ............. 711/106; 711/5; 711/105; 365/222
(58) Field of Classification Search .................. 711/106, 711/5, 105; 365/222
See application file for complete search history.

(56) References Cited

U.S. PATENT DOCUMENTS

| | | | |
|---|---|---|---|
| 4,687,107 A | 8/1987 | Brown et al. | |
| 5,796,669 A * | 8/1998 | Araki et al. | 365/222 |
| 5,999,472 A | 12/1999 | Sakurai | |
| 6,310,814 B1 | 10/2001 | Hampel et al. | |
| 6,570,803 B2 * | 5/2003 | Kyung | 365/222 |
| 7,200,062 B2 * | 4/2007 | Kinsely et al. | 365/222 |
| 2002/0023193 A1 | 2/2002 | Nakamura | |
| 2003/0007406 A1 | 1/2003 | Kyung | |
| 2003/0218930 A1 | 11/2003 | Lehmann et al. | |
| 2004/0184337 A1 | 9/2004 | Jakobs | |

FOREIGN PATENT DOCUMENTS

| | | |
|---|---|---|
| JP | 2008500679 | 1/2008 |
| JP | 2008500680 | 1/2008 |
| JP | 2008500681 | 1/2008 |
| WO | WO9730453 | 8/1997 |
| WO | 9919879 | 4/1999 |

OTHER PUBLICATIONS

International Search Report, PCT/US05/047037, International Searching Authority, European Patent Office, May, 18, 2006.
Written Opinion, PCT/US05/047037, International Searching Authority, European Patent Office, May 18, 2006.
International Preliminary Report on Patentability, PCT/US05/047037, International Search Authority, European Patent Office, Jul. 3, 2007.

* cited by examiner

*Primary Examiner* — Yong Choe
(74) *Attorney, Agent, or Firm* — Peter M. Kamarchik; Nicholas J. Pauley; Jonathan T. Velasco

(57) ABSTRACT

In a directed auto-refresh (DARF) mode, refresh commands are issued by a controller, and refresh row and bank addresses are maintained internally to a memory module. A bank address counter internal to the memory is initialized to a first predetermined value upon entering DARF mode. The memory refreshes the currently addressed bank in response to a DARF command, and increments the bank address counter in a predetermined sequence. The controller tracks the bank address, and may issue one or more memory access commands while a DARF operation is being performed, if the memory access and the refresh are directed to different banks. Upon exiting a self-refresh mode, the bank address counter assumes a second predetermined value. The second predetermined value may be fixed, or may be n+1, where n is the value of the bank address counter when self-refresh mode is initiated.

8 Claims, 3 Drawing Sheets

DIRECTED AUTO-REFRESH SYNCHRONIZATION

This application claims priority to U.S. Provisional Application No. 60/640,100, filed Dec. 28, 2004.

BACKGROUND

The present invention relates generally to the field of memory and in particular to a system and method for synchronizing bank addresses between a controller and memory in a directed auto-refresh mode.

Microprocessors, digital signal processors, and other controllers perform computational tasks in a wide variety of applications, including embedded applications such as portable electronic devices. The trend is to ever-expanding feature sets and enhanced functionality of such devices, including increased memory, as well as more computationally powerful processors, in each product generation. Another trend of portable electronic devices is an ever-shrinking form factor. A major impact of this trend is the decreasing size of batteries used to power the controller, memory, and other electronics in the device, making power efficiency an increasingly important design goal. Hence, improvements to the controller and/or memory that increase execution speed and reduce power consumption are desirable, particularly for portable electronic device processors.

Dynamic Random Access Memory (DRAM) is well known in the art as being among the most cost-effective of solid state, or electronic, data storage technologies. DRAM stores binary data by charging or discharging individually addressable capacitive circuits. To achieve high bit density, and therefore low cost per bit, circuits that retain this charge indefinitely are omitted in DRAM technologies. Consequently, the charge dissipates due to leakage currents. To preserve the state of data stored in DRAM, the capacitive circuits storing bit values must be periodically charged, or "refreshed."

DRAM arrays are commonly implemented as horizontal, rectangular, two-dimensional arrays comprising a plurality of rows and columns. Data bits are accessed by providing a row address and a Row Address Strobe (RAS) control signal, followed by a column address and a Column Address Strobe (CAS). Once a once a given row is accessed or "opened," a large number of bit positions may be accessed by incrementing the column address. Thus, the delay in providing a row address and RAS signal may be amortized over many column accesses, particularly for long, sequential data accesses. This feature is further exploited by Fast Page Mode (FPM) and Extended Data Out (EDO) DRAM technologies, as known in the art. As higher densities of DRAM are packaged into modules, another organizational technique is to divide segments of memory into separately addressable banks. In a representative implementation, the memory address may be mapped to DRAM as shown below:

| MSB | | | | | LSB |
|---|---|---|---|---|---|
| ROW | B1 | B0 | COLUMN | BYTE SELECT | |

The lower order bits may comprise a byte-select field, where the memory module provides data spanning several bytes in a single access. The next most significant bits are the column address, allowing data within the same row to be rapidly accessed. Above the row address are bank select bits, which independently address one of a plurality of DRAM banks (in this example, four banks). The row address comprises the more significant bits. Those of skill in the art will recognize that memory addresses may be mapped to the memory in a variety of ways; the above mapping is thus illustrative only, and not limiting.

Traditional DRAM is explicitly refreshed under the direction of a controller. The controller places the address of a row to be refreshed on the address bus, and asserts the RAS signal to refresh every memory storage location in that row. During a refresh cycle, all memory access operations are halted (i.e., no read or write operation may occur during a refresh cycle). A refresh counter in the controller provides the refresh row address, and the counter is incremented following each refresh cycle. All rows in the DRAM array may be refreshed sequentially. This is known in the art as a burst refresh, and must be executed once within the total required refresh time of the memory array. Alternatively, the controller may implement a distributed refresh, wherein refresh cycles directed to successive rows are interspersed among memory access cycles. The average allowable delay between distributed refresh cycles is the memory array total required refresh time divided by the number of rows.

With the advent of CAS-before-RAS refresh (CBR refresh), the controller was alleviated of the need to calculate and supply a row address for refresh cycles. A memory module that supports CBR refresh includes an internal row counter, which it increments upon receiving every CBR refresh cycle. The controller is unaware of which row is being refreshed at any given time; the controller is simply required to issue CBR refresh cycles within the required time period. The CBR refresh is one example of what is broadly referred to herein as auto-refresh—wherein a controller directs memory to issue a refresh cycle, but it is unaware of the specific row address being refreshed. In modern Synchronous DRAM (SDRAM) implementations, an auto-refresh cycle is commonly performed in response to the RAS and CAS signals being asserted simultaneously.

One disadvantage of conventional auto-refresh techniques (and additionally, traditional refreshes in which the controller supplies the refresh row address, if the banks are not independently refreshed) is that the controller is forced to close all DRAM rows to memory access operations (i.e. read and write accesses) prior to issuing an auto-refresh command. This may adversely impact processor performance by delaying data accesses and/or instruction fetches.

One solution, where the banks are independently refreshed, is for the controller to explicitly handle the refresh process by providing the row address and bank select information for each refresh command. In this case, the controller may direct a refresh cycle to one DRAM bank while simultaneously performing data access operations to remaining banks. A sophisticated controller may organize its memory operations to take advantage of this ability, thus improving performance.

A disadvantage of this approach, however, is that the controller cannot take advantage of the self-refresh mode offered by many modern memory implementations, which have particular applicability to portable electronic devices. In self-refresh mode, data is retained in the DRAM array during periods of inactivity, with minimum power consumption, and data access is disallowed. That is, data may not be written to or read from the DRAM array during self-refresh mode. DRAM with a self-refresh mode enables many circuits, including the controller, to enter an inactive or "sleep" mode to preserve battery power.

During self-refresh, the memory module cycles through the DRAM array, performing the minimum refresh activity necessary to maintain the data. To accomplish this, the memory module maintains an internal row/bank address counter that is not accessible to the controller. Upon exiting the self-refresh mode, the controller is not aware of which row was last refreshed in self-refresh mode, and consequently cannot continue explicit refresh operations unless it first performs a burst refresh to every row in sequence.

SUMMARY

In a directed auto-refresh (DARF) mode, refresh commands are issued by a controller, and refresh row and bank addresses are maintained internally to a memory module. The controller and the memory are synchronized with respect to the bank address by specifying that a bank address counter internal to the memory be initialized to a first predetermined value upon entering DARF mode. The memory performs a refresh cycle directed to the addressed bank upon receiving a refresh command, and increments the bank address counter in a predetermined sequence following the refresh cycle. The controller tracks the bank address, and may issue one or more memory access operations during the execution of a refresh command, if the memory access operation is directed to a bank not being refreshed. Synchronization, lost during a self-refresh mode, is reestablished upon exiting self-refresh mode by specifying that the bank address counter assume a second predetermined value. The second predetermined value may be fixed, or may be n+1, where n is the value of the bank address counter when self-refresh mode is initiated.

One embodiment relates to a method, by a controller, of synchronizing a refresh bank address with a refresh bank address counter in a memory module. The memory module is commanded to enter a directed auto-refresh mode. Directed auto-refresh cycles are issued to the memory beginning at a first predetermined bank address.

Another embodiment relates to a method, by a memory module, of refreshing a plurality of memory banks. A synchronization command is accepted from a controller. A bank refresh counter is set to a predetermined bank address in response to the synchronization command.

Another embodiment relates to an electronic device. The electronic device includes a controller operative to read and write data to a memory module, and further operative to place the memory module in a directed auto-refresh mode and to issue directed auto-refresh commands. The electronic device includes a memory module having at least two banks of DRAM, each bank separately addressable for performing refresh cycles. The memory module is operative in a directed auto-refresh mode to perform a refresh cycle directed to one bank, and to perform a memory access cycle to a different bank during the refresh operation, in response to commands from the controller. A bank address counter in the memory module is operative to assume a first predetermined value upon the memory module entering directed auto-refresh mode.

DETAILED DESCRIPTION

Figure 1:
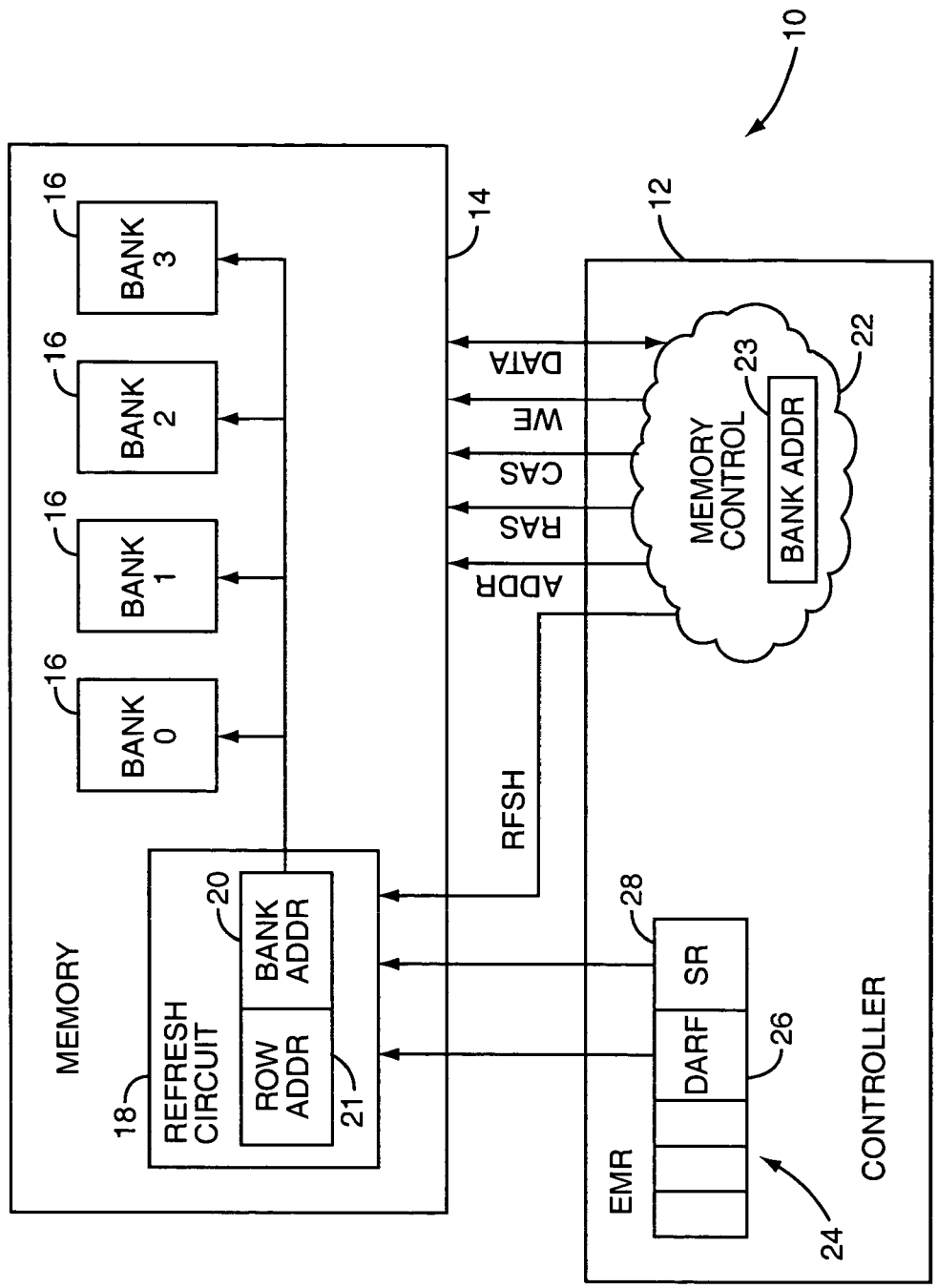
FIG. 1 is a functional block diagram of a controller and a memory module.

FIG. 1 depicts a representative computer system 10 comprising a controller 12 and memory module 14. The controller 12 may comprise a microprocessor, a digital signal processor, a sophisticated state machine implemented in an FPGA or ASIC, or other controller. The memory module 14 may comprise a single DRAM chip, a multi-chip module, a SIMM or DIMM array of DRAM modules, or the like. The memory module 14 includes, in the embodiment depicted, four DRAM banks 16 and a refresh circuit 18, which includes a bank address counter 20 and row address counter 21. The refresh circuit 18 performs refresh cycles to the DRAM banks 16 upon receiving refresh commands from the controller 12 in a directed auto-refresh mode, or autonomously during a self-refresh mode. Additionally, the refresh circuit may support other refresh modes as known in the art. The memory module 14 also includes row and column address latches, sense amps, bus drivers, and various other circuits (not shown) common to DRAM memory and well known in the art.

The controller 12, in the embodiment depicted in FIG. 1, includes a memory control circuit 22 operative to perform read and write operations to the memory module 14. Accordingly, FIG. 1 depicts common address, data, and control signal (e.g., RAS, CAS and WE) connections between the memory control circuit 22 in the controller 12 and the memory module 14. These control signals are representative only, are not exhaustive, and do not include many of the various control signals that may interface a controller 12 and memory 14 in any given implementation.

The memory control circuit 22 additionally generates a refresh signal, as depicted by the RFSH signal, to the memory module 14 in at least one mode. The signal RFSH is representative only; in any given implementation, the memory control circuit 22 may issue an auto-refresh command via other control signals. The memory control circuit 22 also includes a bank address counter 23, which mirrors the value of the bank address register 20 in the memory module 14 during directed auto-refresh mode.

The controller 12 additionally includes an Extended Mode Register (EMR) 24. This register may include a plurality of mode bits and other configuration information, as necessary or desired in any given implementation. In one embodiment, the EMR 24 includes a Directed Auto-ReFresh (DARF) bit 26. The EMR 24 additionally includes a Self-Refresh (SR) bit 28. The controller 12 may include a variety of additional circuits, registers, and other components (not shown) as well known in the art.

According to one embodiment, the memory module 14 enters a directed auto-refresh mode in response to the controller 12 setting the DARF bit 26 in the EMR 24. When the DARF bit 26 is set, the memory bank address counter 20 is set to a predetermined value, and the controller bank address counter 23 is set to the same value. Commonly, the bank address counter 20 may be set to zero. However, those of skill in the art will recognize that the bank addresses may be set to any predetermined value, so long as the controller 12 is aware of the predetermined value utilized.

When incremented following each directed auto-refresh cycle, the bank address counter 20 will cycle through bank addresses in a predetermined sequence. In a preferred embodiment, the bank address counter 20 cycles through a binary count (e.g., 0, 1, ... m−1, for m banks). However, those of skill in the art will readily recognize that the bank address counter 20 may cycle through the bank address bits in any sequence, so long as the controller 12 is aware of the particular sequence utilized, so that the bank address register 23 may use the same sequence.

In one illustrative embodiment, during directed auto-refresh mode, the memory module 14, upon receiving a refresh command from the controller 12, will perform a refresh operation to the row and bank address bits in the corresponding counters 21, 20. The bank address counter 20 will then be incremented by one following the refresh operation. When the bank address counter 20 has cycled through a complete sequence (i.e., having issued a refresh cycle to each bank for a given row address), the row address counter 21 is incremented by one.

The controller 12 maintains the bank address counter 23 to mirror the bank address counter 20, and increments the bank address counter 23 every time an auto-refresh command is issued to the memory module 14. Since the controller 12 and memory module 14 initialize to the same predetermined bank address, increment the bank address at the roughly the same time (following each auto-refresh command) and by the same amount and in the same order, the controller 12 and the memory module 14 are synchronized with respect to bank addresses in directed auto-refresh mode.

This synchronization allows the controller 12, which is aware of the bank 16 being refreshed when it issues a refresh command, to continue to perform read and write accesses to any DRAM bank 16 other than the bank 16 being refreshed. Note that the controller 12 does not need to be aware of the refresh row address. All rows must be closed during the refresh operation only in the bank 16 being refreshed; the controller 12 may read or write any address in any other bank 16. Thus, the controller 12 may "hide" directed auto-refresh cycles by scheduling memory accesses such that the directed auto-refresh cycles do not impact memory access performance.

Figure 2:
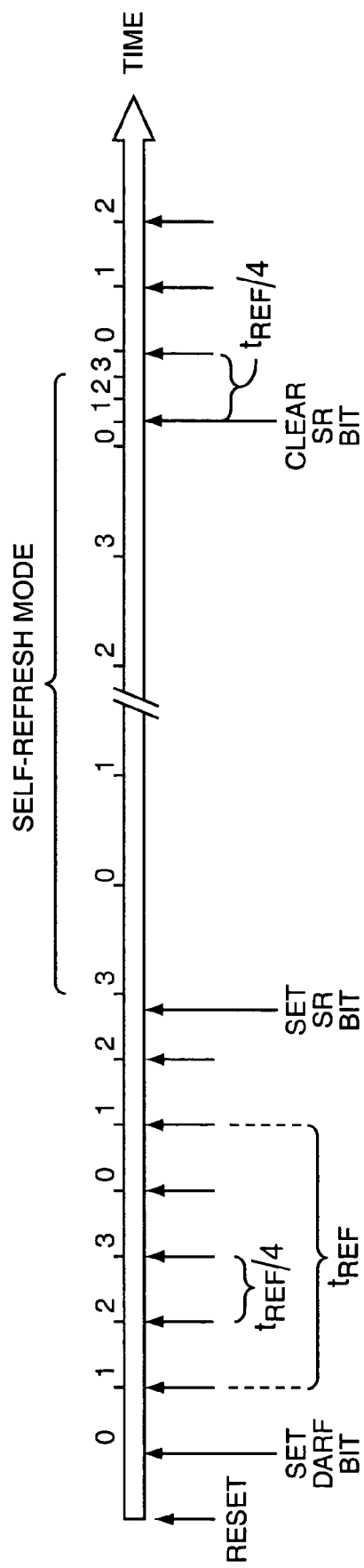
FIG. 2 is a timeline depicting refresh operations and values of a bank address counter in various modes.

FIG. 2 depicts a timeline view of refresh activity between the controller 12 and the memory module 14. Actions and status of the controller 12 are depicted below the timeline. Refresh cycles are depicted as "ticks" above the timeline, and the value of the bank address counter 20 is depicted above the timeline. At the left-most point (the beginning of time of interest), the controller 12 is reset. This may correspond to an initial power-up, a software reset, or the like. If the controller 12 wishes to enter directed auto-refresh mode and obtain maximum memory access performance, the controller 12 sets the DARF bit 26. This places the memory module 14 in directed auto-refresh mode, and forces the bank address counter 20 to a predetermined value, such as zero in the embodiment depicted in FIG. 2.

The controller 12 may then proceed to perform memory access operations on the memory module 14, periodically issuing directed auto-refresh commands, as indicated by arrows in FIG. 2, at periodic points along the timeline. The time during which all DRAM banks 16 within a given row must be refreshed is indicated in FIG. 2 as $t_{REF}$. Correspondingly, the controller 12 may space out the per-bank, directed auto-refresh commands to an average value of $t_{REF}/4$, as indicated. Upon receiving each directed auto-refresh command, the memory module 14 performs a refresh to the bank addressed by the bank address counter 20, and then increments the bank address counter 20. When the bank address counter 20 cycles through a complete sequence (0, 1, 2, 3 in the embodiment depicted) the row address 21 is incremented. The controller increments the bank address counter 23 upon issuing each directed auto-refresh command. Thus, the memory controller 22 is aware of the value of the bank address counter 20, and may perform read and write operations to the memory module 14 simultaneously with the directed auto-refresh activity, by directing the memory accesses to DRAM banks 16 other than the bank 16 currently being refreshed.

According to one or more embodiments of the present invention, the controller 12 may take advantage of a self-refresh mode of the memory module 14. In particular, the controller 12 may direct the memory module 14 to enter a self-refresh mode, such as by setting the SR bit 28 in the EMR 24. The use of an SR bit 28 to direct the memory module 14 into and out of self-refresh mode is representative only; those of skill in the art will recognize that the controller 12 may communicate the self-refresh mode to the memory module in a variety of ways other than setting an SR bit 28. For example, a common technique to direct SDRAM into self-refresh mode is to hold the Chip Select (CS), RAS, CAS and Clock Enable (CKE) control signals low simultaneously; self-refresh exit occurs when CKE is returned high.

During directed auto-refresh mode, the memory module 14 maintains the row and bank address to be refreshed, but leaves the refresh timing to the controller 12. Accordingly, when the memory module 14 receives the command to enter self-refresh mode, it is unaware of the elapsed time since the last directed auto-refresh cycle. Consequently, according to one embodiment, the refresh circuit 18 of the memory module 14 must perform a refresh cycle immediately upon entering self-refresh mode. As used herein, the term "immediately" means within a predetermined time period that is short relative to $t_{REF}/4$. The refresh cycle may be directed to the currently addressed bank, or alternatively the memory module 14 may simultaneously refresh all DRAM banks immediately upon entering self-refresh mode.

During self-refresh mode, the memory module 14 continues to perform refresh cycles as necessary to maintain data in the DRAM banks 16. In general, the timing of self-refresh mode refresh cycles is temperature-dependent, and the time between refresh cycles may exceed $t_{REF}/4$. The controller 12 has no visibility into the refresh activity, does not know the number or timing of refresh cycles, and cannot track the contents of the bank address counter 20. That is, the controller 12 and the memory module 14 become de-synchronized with respect to bank address when the memory module 14 is in self-refresh mode.

To re-establish synchronization upon exiting self-refresh mode, the bank address counter 20 must contain a predetermined value, so that the bank address counter 23 may be set to the same value. In addition, since the controller 12 does not know when the last internal refresh cycle occurred during self-refresh mode, the refresh circuit 18 issues at least one refresh cycle immediately upon detecting the command to exit self-refresh mode (e.g., in the embodiment illustrated, upon the controller 12 clearing the SR bit 28). This ensures that the controller 12 has $t_{REF}/4$ to issue another directed auto-refresh command, without risk of loss of data.

In one embodiment, upon detecting the command to exit self-refresh mode, the refresh circuit 18 performs a refresh cycle to the currently addressed bank, and increments the bank address counter 20. If the contents of the bank address counter 20 do not then match the self-refresh exit predetermined value, the bank address counter 20 is incremented through its sequence and refresh cycles performed to the addressed banks, until its contents match the self-refresh exit predetermined value. Once the value of the bank address counter 20 is set to the self-refresh exit predetermined value (and the bank address counter 23 is set correspondingly), the controller 12 and memory module 14 have reestablished bank address synchronization. The controller 12 may then continue to issue directed auto-refresh commands, while simultaneously performing memory access operations on banks other than the bank being refreshed.

In another embodiment, rather than perform sequential bank refresh cycles until the bank address counter 20 reaches the self-refresh exit predetermined value, the memory module 14 may refresh all banks simultaneously, and set the bank address counter 20 to the self-refresh exit predetermined value. This approach may reduce the latency upon exiting self-refresh mode until the memory module 14 is ready to accept and fulfill memory access requests from the controller 12, particularly for a large number of banks, such as eight or more.

There are at least two possibilities for the self-refresh exit predetermined bank address. In one embodiment, upon exiting self-refresh mode, the bank address 20 is always set to a predetermined value, for example zero. However, those of skill in the art will readily recognize that the bank address counter 20 may be set to any predetermined value, so long as the controller 12 is aware of the value being utilized, so that the bank address counter 23 may be set to the same value.

In another embodiment, the self-refresh exit predetermined bank address is the contents of the bank address counter 20 when it entered self-refresh mode. That is, if the last bank refreshed in directed auto-refresh mode prior to self-refresh mode was n, the self-refresh exit predetermined bank address is n+1. In this embodiment, the bank address counter 23 need not be reset or otherwise set to a predetermined value, but rather the controller 12 may continue issuing directed auto-refresh commands as if the synchronization had never been broken in self-refresh mode.

Figure 3:
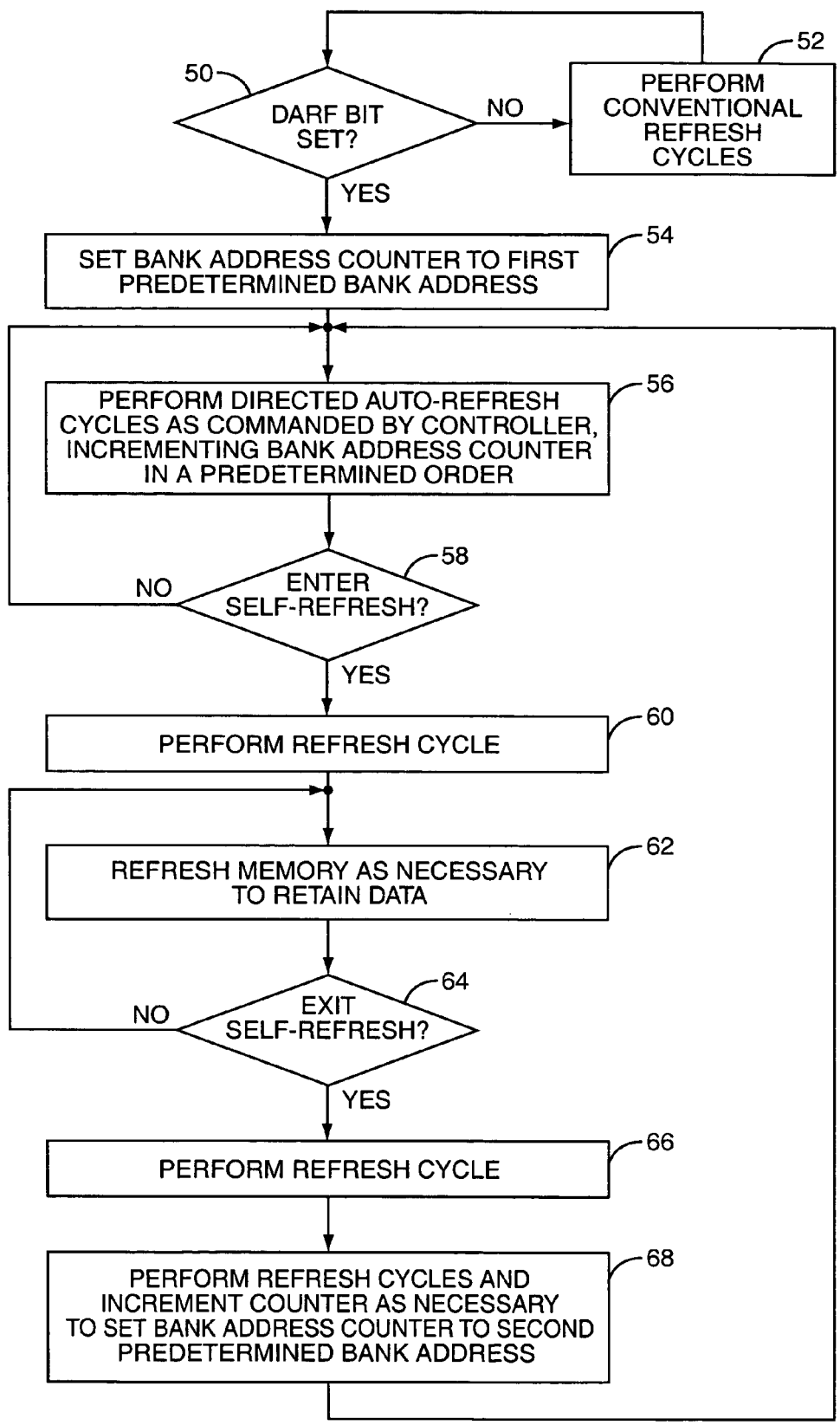
FIG. 3 is a flow diagram of a method of DRAM refresh.

FIG. 3 depicts a flow diagram of a method of refreshing a memory, according to one or more embodiments. The memory 14 checks for directed auto-refresh mode, such as for example by inspecting a DARF bit 26 (block 50). If the memory 14 is not placed in directed auto-refresh mode, it performs conventional refresh cycles (block 52). These may occur in a traditional refresh mode, wherein the controller 12 supplies a refresh row address, or a conventional auto-refresh mode, wherein the memory module 14 maintains the row address. In either case, the memory module 14 may be commanded to directed auto-refresh mode at any time (block 50) (albeit with risk of loss of data in the case of traditional refresh mode, since there is no synchronization of row addresses between the controller 12 and the memory 14).

Upon detecting a command to enter directed auto-refresh mode (block 50), the memory module 14 sets the bank address counter 20 to a first predetermined bank address, such as for example zero (block 54). The memory module 14 then performs directed auto-refresh cycles to the DRAM banks 16 as commanded by the controller 12. Following each refresh cycle, the memory module 14 increments the bank address counter 20 in a predetermined order (block 56). This allows the controller 12 to track the value of the bank address counter 20 by similarly incrementing bank address counter 23.

The controller 12 may command the memory module 14 to enter a self-refresh mode (block 58). If the memory module 14 is placed in self-refresh mode, it immediately performs a refresh cycle (block 60), as it is not aware of the delay since the last directed auto-refresh cycle. The memory module 14 will then perform DRAM refresh cycles as necessary to preserve the state of data in the memory. No memory access cycles (e.g., read or write) may be performed in self-refresh mode.

Upon being commanded out of self-refresh mode (block 64), the memory module 14 must perform at least one refresh cycle (block 66). This ensures that the controller 12, which is unaware of the timing of the last refresh cycle performed in self-refresh mode, has until $t_{REF}/4$ after commanding the memory module 14 out of self-refresh mode to issue the next directed auto-refresh. If necessary, the memory module 14 will then perform additional refresh cycles, incrementing the bank address counter 20, to leave a second predetermined value in the bank address counter 20 (block 68). This is necessary to synchronize with the controller 12, which will also have the second predetermined value in bank address counter 23. The controller 12 is then synchronized with the memory module 14 with respect to refresh bank addresses, and may continue issuing directed auto-refresh cycles, while simultaneously performing memory access cycles to DRAM banks 16 other than the one being refreshed.

Although the present invention has been described herein with respect to particular features, aspects and embodiments thereof, it will be apparent that numerous variations, modifications, and other embodiments are possible within the broad scope of the present invention, and accordingly, all variations, modifications and embodiments are to be regarded as being within the scope of the invention. The present embodiments are therefore to be construed in all aspects as illustrative and not restrictive and all changes coming within the meaning and equivalency range of the appended claims are intended to be embraced therein.

What is claimed is:

1. An electronic device, comprising:
   a controller operative to read and write data to a memory module, and further operative to place the memory module in a directed auto-refresh mode and to issue directed auto-refresh commands, the controller maintaining a refresh bank address at the controller equal to a bank address counter at the memory module throughout the directed auto-refresh mode; and
   the memory module having at least two banks of dynamic random access memory (DRAM), each bank separately addressable for performing refresh cycles, the memory module operative in the directed auto-refresh mode to perform a refresh cycle directed to one bank, and to perform a memory access cycle to a different bank while the refresh cycle is being performed, in response to the directed auto-refresh commands from the controller; and
   the bank address counter in the memory module operative to assume a first predetermined value upon the memory module entering directed auto-refresh mode, wherein the controller is further operative to remove the memory module from self-refresh mode, and wherein the bank address counter is operative to assume a second predetermined value upon exiting self-refresh mode,
   and wherein the memory module is operative to perform successive refresh cycles to the DRAM banks and increment the bank address counter as necessary to set the bank address counter to the second predetermined value upon exiting self-refresh mode.

2. The electronic device of claim 1 wherein the bank address counter is further operative to increment in a predetermined sequence following each directed auto-refresh cycle.

3. The electronic device of claim 1 wherein the controller is further operative to place the memory module in a self-refresh mode, and wherein the memory module performs a refresh cycle directed to a DRAM bank immediately upon entering self-refresh mode.

4. The electronic device of claim 1 wherein the memory module is operative to simultaneously refresh all DRAM banks and set the bank address to the second predetermined value upon exiting self-refresh mode.

5. The electronic device of claim 1 wherein the second predetermined value is fixed.

6. The electronic device of claim 1 wherein the second predetermined value is equal to the first predetermined value.

7. The electronic device of claim 1 wherein the second predetermined value is n+1, where n is the bank address corresponding to the last directed auto-refresh cycle issued by the controller prior to the self-refresh mode.

8. An electronic device, comprising:
   means for controlling operative to read and write data to a means for storing memory, and further operative to place the means for storing memory in a directed auto-refresh mode and to issue directed auto-refresh commands, the means for controlling maintaining a refresh bank address at the controller equal to a bank address counter at the means for storing memory throughout the directed auto-refresh mode; and
   the means for storing memory having at least two banks of dynamic random access memory (DRAM), each bank separately addressable for performing refresh cycles, the means for storing memory operative in the directed auto-refresh mode to perform a refresh cycle directed to one bank, and to perform a memory access cycle to a different bank while the refresh cycle is being performed, in response to the directed auto-refresh commands from the means for controlling; and
   means for counting bank addresses in the means for storing memory operative to assume a first predetermined value upon the means for storing memory entering directed auto-refresh mode,
   wherein the means for controlling is further operative to remove the means for storing memory from self-refresh mode, and wherein the means for counting bank addresses is operative to assume a second predetermined value upon exiting self-refresh mode, and
   wherein the means for storing memory is operative to perform successive refresh cycles to the DRAM banks and increment the means for counting bank addresses as necessary to set the means for counting bank addresses to the second predetermined value upon exiting self-refresh mode.

* * * * *